(12) United States Patent
Barndt et al.

(10) Patent No.: US 11,562,787 B2
(45) Date of Patent: Jan. 24, 2023

(54) MULTI-STATE PROGRAMMING FOR MEMORY DEVICES

(71) Applicant: Western Digital Technologies, Inc., San Jose, CA (US)

(72) Inventors: Richard David Barndt, San Diego, CA (US); Bernardo Rub, Sudbury, MA (US); Mostafa El Gamal, Worcester, MA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/356,413

(22) Filed: Jun. 23, 2021

(65) Prior Publication Data

US 2021/0319828 A1    Oct. 14, 2021

Related U.S. Application Data

(63) Continuation of application No. 17/127,290, filed on Dec. 18, 2020, now Pat. No. 11,087,836, which is a continuation of application No. 16/936,320, filed on Jul. 22, 2020, now Pat. No. 10,878,896, which is a continuation of application No. 16/221,332, filed on Dec. 14, 2018, now Pat. No. 10,748,606.

(51) Int. Cl.
| | |
|---|---|
| *G11C 16/10* | (2006.01) |
| *G11C 11/56* | (2006.01) |
| *G11C 16/08* | (2006.01) |
| *G06F 11/10* | (2006.01) |
| *G11C 29/00* | (2006.01) |
| *G06F 3/06* | (2006.01) |

(52) U.S. Cl.
CPC ........ *G11C 11/5628* (2013.01); *G06F 3/0679* (2013.01); *G06F 11/1072* (2013.01); *G11C 16/08* (2013.01); *G11C 16/10* (2013.01); *G11C 29/781* (2013.01); *G11C 29/802* (2013.01); *G11C 2211/5623* (2013.01)

(58) Field of Classification Search
CPC .................................................. G11C 16/10
USPC .................................................. 365/185.28
See application file for complete search history.

(56) References Cited

U.S. PATENT DOCUMENTS

| | | | |
|---|---|---|---|
| 8,885,410 B2 | 11/2014 | Marcu et al. | |
| 9,400,713 B2 | 7/2016 | Gorobets | |
| 10,705,966 B1 | 7/2020 | Rub | |
| 2017/0192902 A1 | 7/2017 | Hwang | |

(Continued)

*Primary Examiner* — Jason Lappas
(74) *Attorney, Agent, or Firm* — Morgan, Lewis & Bockius LLP (57) ABSTRACT

Storage device programming methods, systems and media are described. A method may include encoding data to generate an encoded set of data. A first programming operation may write the encoded set of data to a memory device. The method includes encoding, using a second encoding operation based on the data, to generate a second set of encoded data. The second set of encoded data is stored to a cache. A first decoding operation is performed, based on the second set of encoded data and the encoded set of data, to generate a decoded set of data. A second decoding operation is performed to generate a second decoded set of data. The second decoded set of data is encoded to generate a third set of encoded data. The method includes performing a second programming operation to write the third set of encoded data to the memory device.

20 Claims, 5 Drawing Sheets

(56) References Cited

U.S. PATENT DOCUMENTS

| | | |
|---|---|---|
| 2017/0287568 A1* | 10/2017 | Yang .................. G11C 16/3431 |
| 2018/0314448 A1 | 11/2018 | Grossman |
| 2020/0090759 A1 | 3/2020 | Sharma |

* cited by examiner

MULTI-STATE PROGRAMMING FOR MEMORY DEVICES

CROSS-REFERENCE TO RELATED APPLICATIONS

This application is a continuation of application Ser. No. 17/127,290, filed on Dec. 18, 2020, now U.S. Pat. No. 11,087,836, which is a continuation of application Ser. No. 16/936,320 filed on Jul. 22, 2020, now U.S. Pat. No. 10,878,896, which is a continuation of application Ser. No. 16/221,332, filed on Dec. 14, 2018, now U.S. Pat. No. 10,748,606, the entirety of each of which is incorporated herein by reference for all purposes.

BACKGROUND

The subject application relates generally to data storage systems, devices and methods. More specifically, the subject application relates to, for example, without limitation, multi-state programming for writing data to memory devices.

The description provided in the background section should not be assumed to be prior art merely because it is mentioned in or associated with the background section. The background section may include information that describes one or more aspects of the subject technology, and the description in this section does not limit the invention.

BRIEF DESCRIPTION OF THE DRAWINGS

A detailed description will be made with reference to the accompanying drawings.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

In one or more examples, foggy and fine programming techniques for multi-bit per cell NAND flash memory may refer to a two stage or multi-stage programming technique (e.g., "foggy/fine programming") where NAND cell voltages are quickly brought close to desired voltage levels (e.g., as determined by the bit pattern stored in each cell) in a first wordline programming operation (e.g., foggy programming operation), then programmed to their final voltage levels in a second programming operation where the program step size is much smaller (e.g., fine programming operation). When in the foggy state, the data stored on a given flash memory device is unreadable by a controller due to a very high bit error rate that can overwhelm a given error-correcting code (ECC) decoder.

In an example, each of aforementioned programming stages requires the data to be transferred to NAND flash memory from a controller. Thus, the controller needs to store this data throughout the process. In some instances, one or more other wordlines may be foggy programmed between the foggy and fine programming stages on a single wordline. In an example, the memory requirements in the controller can be very large, especially for 4 bit per cell quadruple-level cell (QLC) where 4 pages of data are stored on each wordline. In one or more implementations described herein, the subject technology advantageously reduces the data buffering requirements in the controller during foggy/fine programming, which improves the functionality of a given computing device.

In an example, foggy/fine programming can produce the "best" end result, i.e., the bit error rate (BER) after fine programming is lower than other programming techniques. However, other techniques where the individual pages on a wordline are progressively programmed have been commonly used. The intermediate programming steps are readable and serve as a buffer for a subset of the pages that are to be stored on the wordline. In some cases where the target BER can be achieved in a single pass programming (e.g., full sequence programming) there may not be a need for foggy/fine programming as in the case for an existing generation of Bit Cost Scalable (BiCS) triple-level cell flash (TLC).

In some previous foggy/fine programming implementations (e.g., planar triple-level cell flash), all data may have been buffered in the controller. For some lower performance systems (e.g., with less processing power), such buffering may be less of an issue because there are far fewer concurrent programming operations (e.g., less parallelism). One or more implementations disclosed further herein can reduce an amount of data buffered in the controller in comparison with the aforementioned previous foggy/fine programming implementations where all data was buffered.

In one or more implementations, the subject technology advantageously enables foggy programming to be readable by a given controller. Thus, the subject technology may avoid compromises during foggy programming that might degrade the end result after the fine programming. In an example, this is accomplished by storing redundant information in the controller that can aid in the recovery of data from foggy programming. The amount of redundant information that is stored in the controller for recovering a single foggy wordline need not be page size units, as would be the case in some of the existing approaches described above, but in some implementations this may be required, or desired for simplicity. Although descriptions herein may refer to a single page unit of redundancy for purposes of illustration, it is appreciated that this is not required in some implementations of the subject technology.

One or more implementations of the subject technology provide several performance benefits that improve the functionality of a computer (e.g., computing device). For example, the subject technology enables foggy/fine programming techniques to be utilized without a large increase in memory requirements for the controller. The foggy/fine programming techniques described herein may produce the highest quality (e.g., in terms of lowest BER) end result which can be critical for a flash storage system using QLC-based memory which may have a miniscule margin for errors. As a result, it is appreciated that implementations of the subject technology improve the functionality of a computing device, including a flash storage system as described herein, by at least reducing memory requirements which can also improve processing burdens of such a computing device. Further, latency in writing data, when using foggy/fine programming, to a flash memory device may be improved by utilizing the implementations described in further detail herein, which further improves the functionality of such a computing device. In addition, the implementations described herein may improve decoding latency and reduce decoding complexity of data when using foggy/fine programming thereby improving the performance of the computing device.

Figure 1:
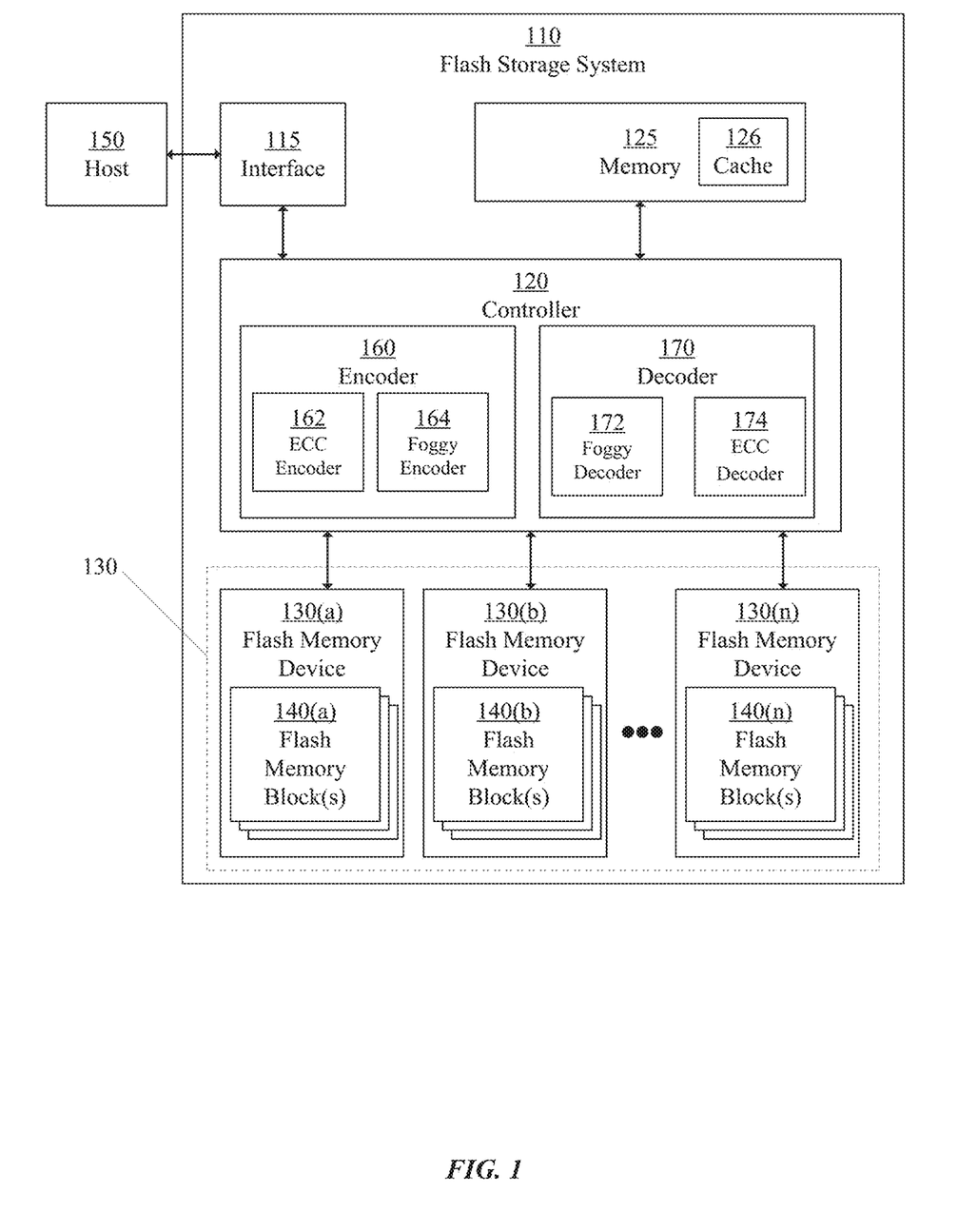
FIG. 1 is a block diagram illustrating components of a flash storage system according to aspects of the subject technology.

FIG. 1 is a block diagram illustrating components of a flash storage system 110 according to aspects of the subject technology. As depicted in FIG. 1, the flash storage system 110 includes an interface 115, a controller 120, a memory 125, a cache 126, an encoder 160, an ECC encoder 162, a foggy encoder 164, a decoder 170, a foggy decoder 172, an ECC decoder 174, and flash memory devices 130. The interface 115 facilitates communication of data, commands, and/or control signals between the flash storage system 110 and a host 150. The controller 120 controls the operation of the flash storage system 110 to store and retrieve data in the flash memory devices 130 (e.g., illustrated as flash memory device 130(a), 130(b) to 130(n) to depict at least several devices) in accordance with commands received from the host 150. The controller 120 may include a single core processor or a multi-core processor which includes several separate computing cores for executing instructions. For example, the computing cores in the multi-core implementation can run respective instructions in parallel including portions of the firmware of the flash storage system 110. The memory 125, which may be a random access memory (RAM), provides temporary storage space for the controller 120 to process commands and transfer data between the host 150 and the flash memory devices 130.

The decoder 170, which may include memory, registers, one or more processors, a system-on-a-chip (SoC), an application specific integrated circuit (ASIC), a field programmable gate array (FPGA) or other programmable logic device, discrete gate or transistor logic device, discrete hardware components, or any combination thereof, and may be integrated with or separate from the controller 120, decodes data using various decoding schemes. The memory 125 may include the cache 126. Alternatively, the cache 126 may be implemented separately from the memory 125 as a separate volatile memory (e.g., random access memory), which could be faster memory than the memory 125. The encoder 160, which may include memory, registers, one or more processors, a system-on-a-chip (SoC), an application specific integrated circuit (ASIC), a field programmable gate array (FPGA) or other programmable logic device, discrete gate or transistor logic device, discrete hardware components, or any combination thereof, and may be integrated with or separate from the controller 120, encodes data to be written to the flash memory device 130 using various encoding schemes. The operation of each of these components is described in more detail below.

The interface 115 provides physical and electrical connections between the host 150 and the flash storage system 110. The interface 115 is configured to facilitate communication of data, commands, and/or control signals between the host 150 and the flash storage system 110 via the physical and electrical connections. The connection and the communications with the interface 115 may be based on a standard interface such as Universal Serial Bus (USB), Small Computer System Interface (SCSI), Serial Advanced Technology Attachment (SATA), Mini-SATA (mSATA), PCIe, etc. Alternatively, the connection and/or communications may be based on a proprietary interface, although the subject technology is not limited to any particular type of interface.

The host 150 may be a computing device, such as a computer/server, a smartphone, or any other electronic device that reads data from and writes data to the flash storage system 110. The host 150 may have an operating system or other software that issues read and write commands to the flash storage system 110. The flash storage system 110 may be integrated with the host 150 or may be external to the host 150. The flash storage system 110 may be wirelessly connected to the host 150, or may be physically connected to the host 150.

The controller 120 may also include an internal management processor, which may run on one of the cores of the controller 120 in a multi-core implementation. The internal management processor may use the interface 115 to communicate with other components illustrated in FIG. 1, including the host 150, the memory 125, the controller 120, and the flash memory devices 130.

FIG. 1 shows multiple flash memory devices 130. The flash storage system 110 may include one or more flash memory devices 130 and is not limited to a particular number of flash memory devices 130. The flash memory devices 130 may each include a single flash memory chip or die. The flash memory devices 130 may be organized among multiple channels through which data is read from and written to the flash memory devices 130 by the controller 120, or coupled to a single channel. The flash memory devices 130 may be implemented using NAND flash memory including 3D NAND memory, where memory cells are stacked into multiple layers, using triple-level cells (TLC) and/or quadruple-level cells (QLC) which can store three and four bits per cell, respectively. For example, the flash memory devices may include NAND flash memory composed of memory cells that can be programmed to store multiple bits or multiple levels, being termed multi-level cells (MLC) such as the aforementioned TLC and/or QLC.

Additionally, the flash memory devices 130 may each include one or more registers for storing operating parameters of the respective flash memory devices 130. In an example, such operating parameters may include: read operation parameters such as read voltages; write operation parameters such as initial pulse value, incremental pulse value, and pulse width; and erase operation parameters such as initial pulse value, incremental pulse value, and pulse width.

As illustrated, the flash memory devices 130 comprise multiple memory cells distributed into storage blocks such as flash memory blocks 140 (e.g., illustrated as flash memory blocks 140(a), 140(b) to 140(n) to depict at least several blocks in respective flash memory devices). The flash memory devices 130 may have one or more flash memory blocks 140, and the flash memory devices 130 may each have the same or different numbers of flash memory blocks 140. The flash memory blocks 140 may be referred to as data blocks or memory blocks and are addressable by the controller 120 using a physical block address. Each of the flash memory blocks 140 is further divided into multiple data segments or pages addressable by the controller 120 using a physical page address or offset from a physical block address of the storage block containing the referenced page. The pages may store sectors or other host data units. The flash memory blocks 140 represent the units of data that are erased within the flash memory devices 130 in a single erase operation. The pages represent the units of data that are read from or written to the flash memory devices 130 in a read or write operation. Although the flash memory devices 130 are described in terms of blocks and pages, other terminology may be used to refer to these data units within a flash storage device.

It is further understood that the subject technology is not limited to any particular capacity of flash memory. For example, storage blocks may each comprise 32, 64, 128, or 512 pages, or any other number of pages. Additionally, pages may each comprise 512 bytes, 2 KB, 4 KB, or 32 KB, for example. The sectors may each comprise, for example, 512 bytes, 4 KB, or other sizes. There may be one or more sectors per page.

In FIG. 1, the memory 125 and the cache 126 represent volatile memory coupled to and used by the controller 120 during operation of the flash storage system 110. The controller 120 may buffer commands and/or data in the memory 125 and/or the cache 126. The controller 120 also may use the memory 125 and/or the cache 126 to store address mapping tables or lookup tables used to convert logical addresses used by the host 150 into virtual and/or physical addresses corresponding to blocks and pages of the flash memory devices 130. Other types of tables, data, status indicators, etc., used to manage the flash memory devices 130 may also be stored in the memory 125 by the controller 120. The memory 125 and/or the cache 126 may be implemented using dynamic random access memory (DRAM), static random access memory (SRAM), or other types of volatile random access memory without departing from the scope of the subject technology. The controller 120 may also periodically store the contents of the memory 125 and/or the cache 126 into one or more designated flash memory blocks 140, such as before the flash storage system 110 is powered down.

The controller 120 manages the flow of data between the host 150 and the flash memory devices 130. The controller 120 is configured to receive commands and data from the host 150 via the interface 115. For example, the controller 120 may receive data and a write command (also referred to as a "programming" or "program" command herein) from the host 150 to write the data in the flash memory devices 130. The controller 120 is further configured to send data to the host 150 via the interface 115. For example, the controller 120 may read data from the flash memory devices 130 and send the data to the host 150 in response to a read command.

The controller 120 is further configured to manage data stored in the flash memory devices 130, the memory 125, and the cache 126 based on internal control algorithms or other types of commands that may be received from the host 150. For example, the controller 120 is configured to perform operations such as garbage collection (GC), error correction coding techniques (e.g., LDPC), wear leveling, security techniques (e.g., encryption), compression techniques, redundancy techniques (e.g., redundant array of independent disks (RAID) techniques), multi-state programming (e.g., foggy/fine programming), etc. For example, the controller 120 may use error correction coding to provide protection to data written to the flash memory devices 130 and perform foggy/fine programming related to such data. In this regard, in a first programming pass or state, the ECC encoder 162 and the foggy encoder 164 of the controller 120 may encode data received from the host device 150. The controller 114 (or component(s) thereof) then writes the encoded data to the one or more of the flash memory devices 130 and/or buffers the encoded data in the memory 125 and/or the cache 126 as part of the foggy programming pass. In a second programming pass or state, the foggy decoder 172 and the ECC decoder 174 decodes the data from the one or more of the flash memory devices 130 and/or buffered data in the memory 125 and/or the cache 126. The controller 114 (or component(s) thereof) then writes the decoded data to the one or more of the flash memory devices 130 as part of the fine programming pass. In one or more implementations, the cache 126 is separate and distinct from the flash memory devices 130, and the cache 126 is not part of the flash memory devices 130. Examples of foggy/fine programming is described in more detail in FIGS. 2A and 2B below.

When the controller 120 (or component(s) thereof) subsequently reads the data from the one or more of the flash memory devices 130, the data is provided by the controller 120 to the host device 150 via the interface 115. Those skilled in the art will be familiar with other operations performed by a controller in a flash storage device, which will not be described in detail herein.

The controller 120 may be implemented with a general purpose processor, multi-core processor, micro-controller, digital signal processor (DSP), a system-on-a-chip (SoC), an application specific integrated circuit (ASIC), a field programmable gate array (FPGA) or other programmable logic device, discrete gate or transistor logic device, discrete hardware components, or any combination thereof designed and configured to perform the operations and functions described herein. In the multi-core processor implementation, each of the several computing cores can run respective instructions in parallel including portions of the firmware of the flash storage system 110. The controller 120 may perform the operations and functions described herein by executing one or more sequences of instructions stored on a machine/computer readable medium. The machine/computer readable medium may be the flash memory devices 130, the memory 125, the cache 126 or other types of media from which the controller 120 can read instructions or code. For example, flash storage system 110 may include a read only memory (ROM), such as an EPROM or EEPROM, encoded with firmware/software comprising one or more sequences of instructions read and executed by the controller 120 during the operation of the flash storage system 110.

Figure 2A:
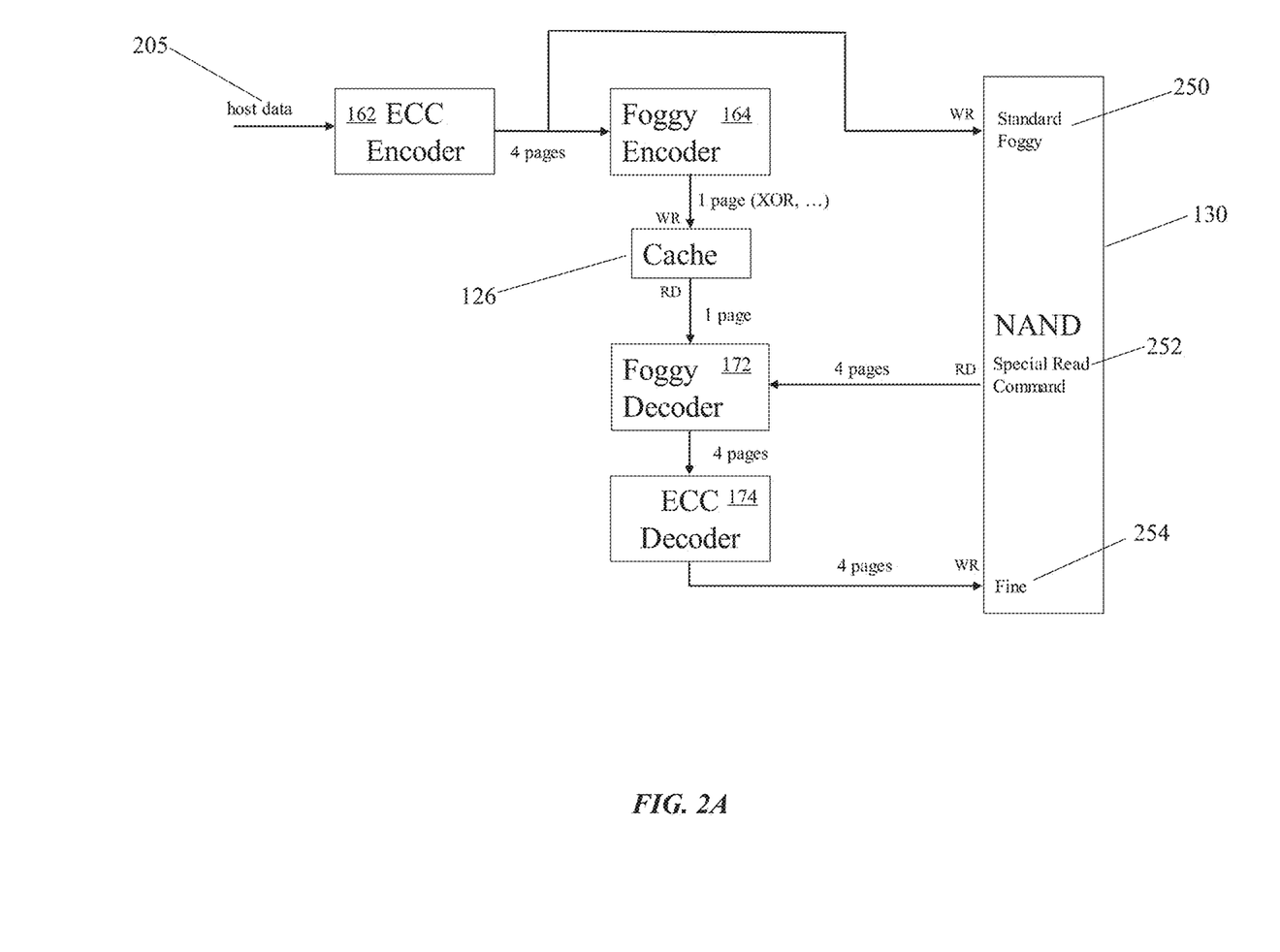
FIG. 2A conceptually illustrates an example of foggy/fine programming provided by various components of a flash storage system in accordance with one or more implementations of the subject technology.

FIG. 2A conceptually illustrates an example of foggy/fine programming provided by various components of a flash storage system in accordance with one or more implementations of the subject technology. FIG. 2A is discussed by reference to components of the flash storage system 110 in FIG. 1.

As illustrated, host data 205 from a host device (e.g., the host 150) is received by the ECC encoder 162. In the example of FIG. 2A, for programming data into NAND flash memory (one or more of the flash memory devices 130) that uses QLC cells (e.g., four bits per cell), four pages of data are written per wordline in order to implement foggy/fine programming in two separate programming passes. Although four pages of data are described in this example, the subject technology can write different numbers of pages based on the type of flash memory. In an example where NAND flash memory uses three bits per cell, three pages of data can be written per wordline instead to implement foggy/fine programming in accordance with implementations of the subject technology.

Using an ECC encoding scheme (e.g., Reed-Solomon, BCH, LDPC, etc.), the ECC encoder 162 encodes the host data 205 generating four pages of encoded data. As a first programming pass in the foggy/fine programming, the controller 120 (or alternatively the ECC encoder 162) performs a foggy programming operation 250 to write the four pages of encoded data to one or more of the flash memory devices 130 (e.g., NAND flash memory) as part of a first programming pass.

The ECC encoder 162 sends the four pages of encoded data to the foggy encoder 164. The foggy encoder 164 receives the four pages of encoded data and encodes the four pages of encoded data generating one page of data. In an implementation, the foggy encoder 164 performs an XOR operation on the four pages of encoded data in order to generate the one page of data to store in a cache. The controller 120 (or alternatively the foggy encoder 164) writes the one page of data into a cache (e.g., the cache 126). In an example, the one page of data stored in the cache is a single additional page which is the result of an XOR operation of the four bits of data in each cell (e.g., for flash memory using QLC). Such an XOR operation of the four bits of data can produce a result of a single bit. When the data mapping to the cells is encoded using a gray code technique, this single bit will toggle on adjacent read levels. Thus, the single bit indicates whether the cell read level is even or odd (e.g., corresponding to an even or odd distribution as discussed further below). When used in conjunction with an alternate set of read thresholds (e.g., during foggy read), this can reduce a requirement of a read operation on flash memory to only distinguish between eight levels rather than sixteen for each cell. The cached bit can then resolve the detection of sixteen levels. In this case, the cached page is also an ECC codeword since it is a linear combination of four codewords. Thus, the cached page can be reliably retrieved in the event that it is to be stored in single-level cell (SLC) NAND by way of example.

In an implementation, the cache (e.g., the cache 126) can store additional ECC parity for each of the four pages that are foggy programmed. In this example, the additional ECC parity amounts to an additional redundancy of twenty-five percent (25%) when the cache is a full NAND page in size. This could be the parity from a distinct encoding of the data (e.g., where the ECC parity stored in flash is not utilized during foggy decoding), or as extended parity that can be used to re-enforce the parity stored in the flash memory during foggy decoding by the foggy decoder 172. In one implementation, the data that is stored in the cache is only additional parity bits for a stronger ECC code which may be used in conjunction with the first ECC code parity, or may not rely on the weaker ECC (written to flash) parity at all.

The controller 120 (or foggy decoder 172) performs a read operation for the one page of data stored in the cache 126. The controller 120 (or foggy decoder 172) performs a second read operation for the four pages of data stored in the flash memory devices 130. In an example, the second read operation is a special read command 252 that enables reading the four pages of data in the foggy state (e.g., written to the flash memory using the aforementioned foggy programming operation). In an implementation, this special read command 252 shifts the read thresholds to be in the center of voltage distributions (e.g., not at the intersections of the distributions in a read operation). An example of such distributions for this special read operation is discussed in more detail in FIGS. 3A AND 3B.

The foggy decoder 172 decodes the four pages of data based at least in part on the one page of data from the cache 126. An example of decoding data is discussed in more detail in FIGS. 3A AND 3B below. The foggy decoder 172 sends the decoded four pages of data to the ECC decoder 174 for ECC decoding.

The ECC decoder 174, using an ECC decoding scheme, further decodes the four pages of data in order to eliminate errors from the data and prepare the data for writing to one or more of the flash memory devices 130. In an example, the decoded data is re-encoded before being programmed to the flash memory devices 130. As a second pass of the foggy/fine programming, the controller 120 (or ECC decoder 174) performs a fine programming operation 254 to write the re-encoded four pages of data into one or more of the flash memory devices 130.

Figure 2B:
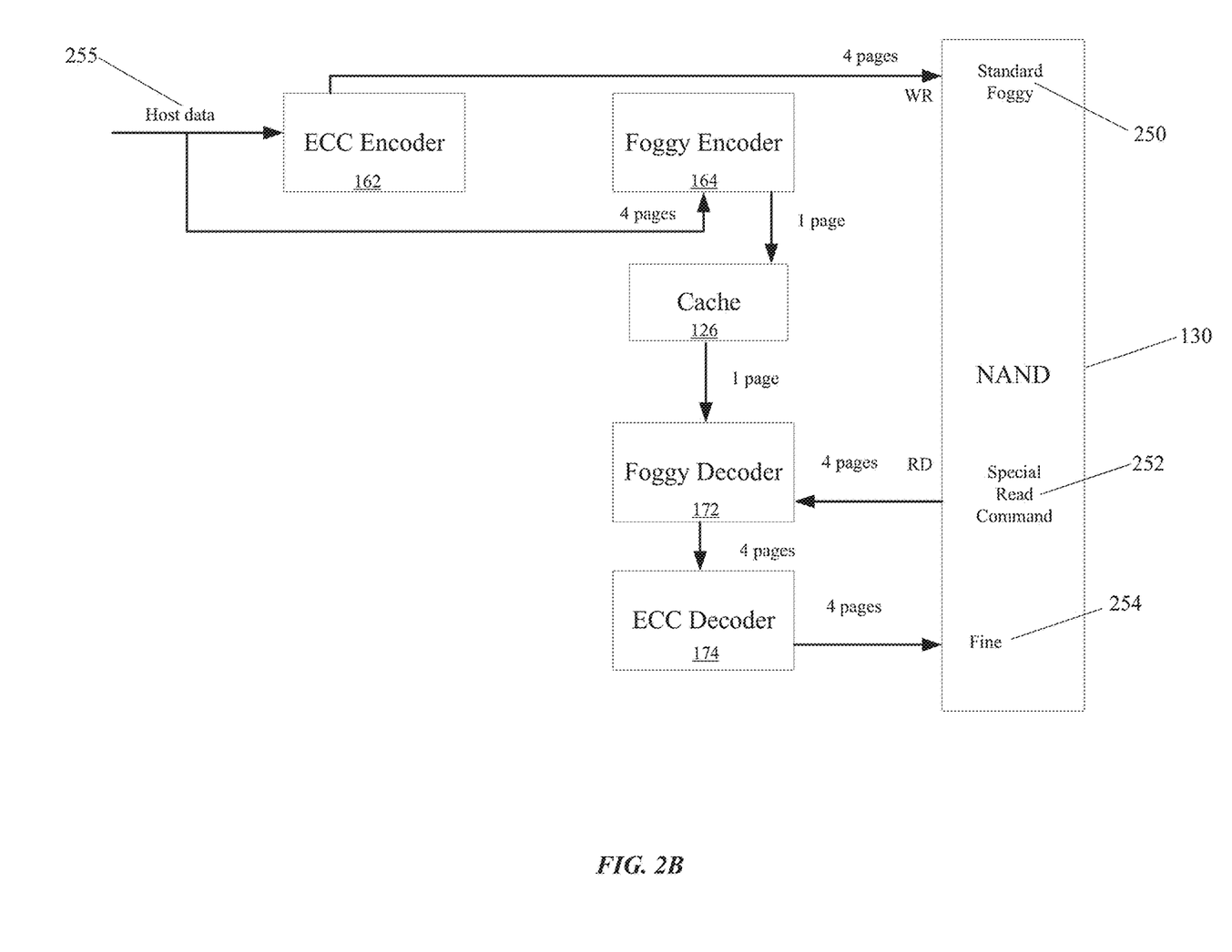
FIG. 2B conceptually illustrates a second example of foggy/fine programming provided by various components of a flash storage system in accordance with one or more implementations of the subject technology.

FIG. 2B conceptually illustrates a second example of foggy/fine programming provided by various components of a flash storage system in accordance with one or more implementations of the subject technology. FIG. 2B will be discussed by reference to components of the flash storage system 110 in FIG. 1. FIG. 2B is similar to FIG. 2A with one difference being that the foggy encoder 164 receives host data from a host (e.g., the host 150).

As illustrated, host data 205 from a host device (e.g., the host 150) is received by the ECC encoder 162. Using an ECC encoding scheme (e.g., Reed-Solomon, BCH, LDPC, etc.), the ECC encoder 162 encodes the host data 205 generating four pages of encoded data. As a first programming pass in the foggy/fine programming, the controller 120 (or alternatively the ECC encoder 162) performs the foggy programming operation 250 to write the four pages of encoded data to one or more of the flash memory devices 130 (e.g., NAND flash memory) as part of a first programming pass.

In the example of FIG. 2B, the foggy encoder 164 also receives the host data 255 directly. As illustrated, host data 205 from a host device (e.g., the host 150) is received by the foggy encoder 164. In this example, the host data 205 includes four pages of data. In an implementation, the foggy encoder 164 performs an XOR operation on the four pages of the host data 255 in order to generate one page of data to store in a cache. The controller 120 (or alternatively the foggy encoder 164) writes the one page of data into a cache (e.g., the cache 126). In an example, the one page of data stored in the cache is a single additional page which is the result of an XOR operation of the four bits of data in each cell (e.g., for flash memory using QLC).

The controller 120 (or foggy decoder 172) performs a read operation for the one page of data stored in the cache 126. The controller 120 (or foggy decoder 172) performs a second read operation for the four pages of data stored in the flash memory devices 130. In an example, the second read operation is a special read command 252 (as described in FIG. 2A) that enables reading the four pages of data in the foggy state (e.g., written to the flash memory using the aforementioned foggy programming operation).

The foggy decoder 172 decodes the four pages of data based at least in part on the one page of data from the cache 126. The foggy decoder 172 sends the decoded four pages of data to the ECC decoder 174 for ECC decoding.

The ECC decoder 174, using an ECC decoding scheme, further decodes the four pages of data in order to eliminate errors from the data and prepare the data for writing to one or more of the flash memory devices 130. In an example, the decoded data is re-encoded before being programmed to the flash memory devices 130. The controller 120 (or ECC decoder 174) then performs a fine programming operation 254 to write the re-encoded four pages of data into one or more of the flash memory devices 130.

Figure 3A:
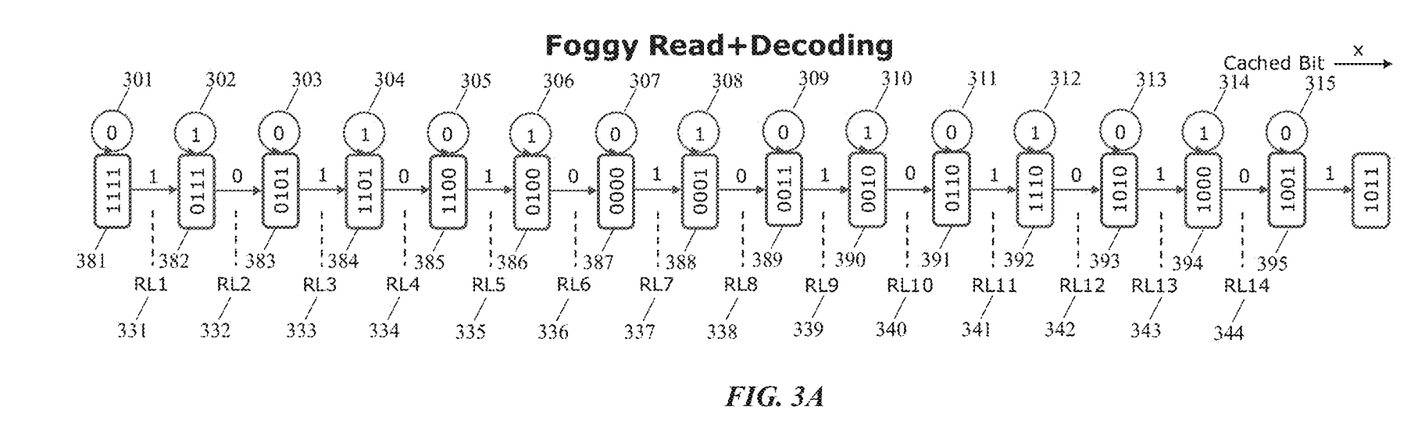
FIGS. 3A and 3B conceptually illustrate an example of reading and decoding data in a foggy state (e.g., data written, using a foggy programming operation, to flash memory) in accordance with one or more implementations of the subject technology.
Figure 3B:
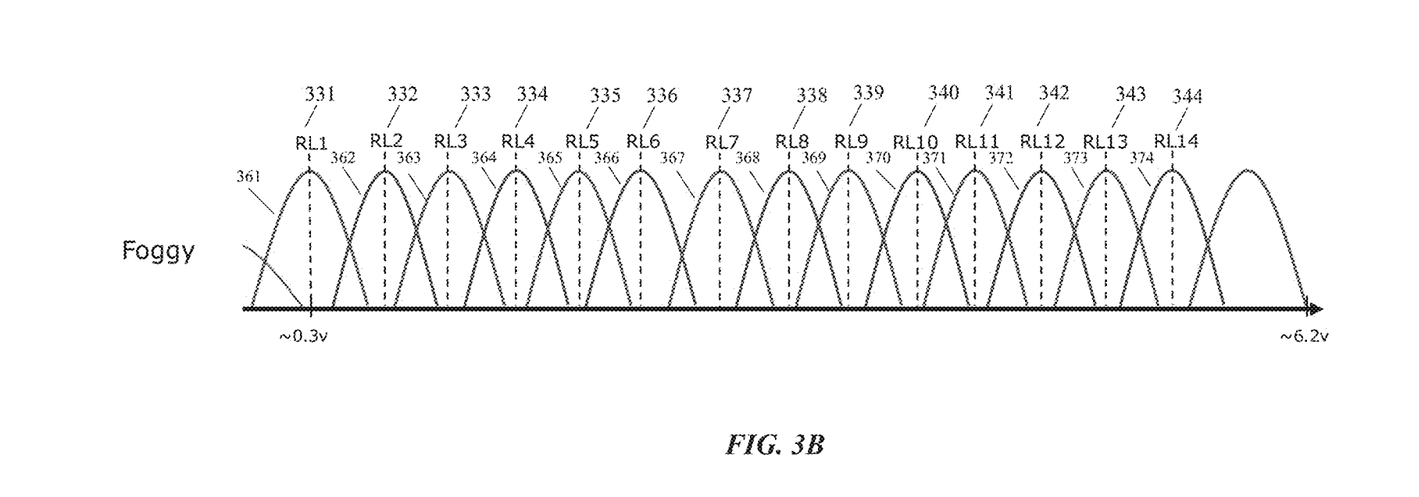

FIGS. 3A and 3B conceptually illustrate an example of reading and decoding data in a foggy state (e.g., data written, using a foggy programming operation, to flash memory) in accordance with one or more implementations of the subject technology. FIGS. 3A and 3B are discussed with reference to components of the flash storage system 110 in FIG. 1. FIG. 3A illustrates an example of a binary representation. FIG. 3B illustrates an example of a graphical representation.

FIGS. 3A and 3B illustrate multiple bits including bit 301, bit 302, bit 303, bit 304, bit 305, bit 306, bit 307, bit 308, bit 309, bit 310, bit 311, bit 312, bit 313, bit 314, and bit 315. These bits may represent cached bits that are stored in the cache as discussed before, which can indicate whether a given distribution is odd or even. The multiple bits represent respective results of an XOR operation on respective four bits of data 381, 382, 383, 384, 385, 386, 387, 388, 389, 390, 391, 392, 393, 394, and 395.

In the case of storing multiple levels of data, the range of possible threshold voltages is divided into the number of levels of data. For example, if four levels of information is stored (two bits of data), there will be four threshold voltage ranges (e.g., distributions) assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges (e.g., distributions) assigned to the data values "000", "001", "010", "011" "100", "101", "110" and "111." If sixteen levels of information (or states) are stored (e.g., for four bits of data) there will be sixteen threshold voltage ranges (e.g., distributions) assigned to the data values "0000", "0001", "0010", "0011" "0100", "0101", "0110", "0111", "1000", "1001", "1010", "1011", "1100", "1101", "1110", and "1111".

Each of the respective four bits of data correspond to data stored in the flash memory (e.g., the four pages of data written to the flash memory using a foggy programming operation as discussed above). In this example, the flash memory uses a quad-level memory cell (QLC) that can store sixteen possible states per cell (e.g., values from 0000 to 1111), yielding four bits of information per cell. Reading data stored in QLC memory therefore can require reading sixteen distributions.

In an example of using QLC memory, when the foggy decoder 172 reads the data in the foggy state from the flash memory devices 130, only fourteen read levels may be required to read sixteen distributions (e.g., instead of fifteen read levels when reading sixteen distributions) as shown in the example of FIGS. 3A and 3B. FIGS. 3A and 3B illustrate these fourteen read levels as read level 331 ("RL1"), read level 332 ("RL2"), read level 333 ("RL3"), read level 334 ("RL4"), read level 335 ("RL5"), read level 336 ("RL6"), read level 337 ("RL7"), read level 338 ("RL8"), read level 339 ("RL9"), read level 340 ("RL10"), read level 341 ("RL11"), read level 342 ("RL12"), read level 343 ("RL13"), and read level 344 ("RL14"). Each of the aforementioned read levels corresponds to either an "odd" distribution or an "even" distribution based on their numerical designation. For example, odd distributions include distribution 361, distribution 363, distribution 365, distribution 367, distribution 369, distribution 371, distribution 373, and distribution 375. Even distributions include distribution 362, distribution 364, distribution 366, distribution 368, distribution 370, distribution 372, and distribution 374.

The controller (e.g., the controller 120) determines respective read levels at the space between each of the even distributions or the space between each of the odd distributions, which is approximately located in the center of the respective distributions as illustrated in FIG. 3. The page stored in the cache (e.g., the cached bits as discussed above) enables the controller to differentiate between the odd distributions and the even distributions.

As illustrated, the distribution 361 "RL1" corresponds to the four bits of data 381 that include four 1s ("1111"). The result of an XOR operation on the four bits of data 381 will be a value of zero (0) corresponding to bit 301 which is stored in the cache. The adjacent even distribution is the distribution 332 "RL2" that includes zero (0) and three ones corresponding to the four bits of data 382 ("0111"). The result of an XOR operation on the four bits of data 382 will be a value of one (1) corresponding to bit 302 which is also stored in the cache. When performing a read operation on the stored data in the foggy state, the value of each of bit 301 or bit 302 from the cache enables the controller to determine whether the corresponding distribution is odd or even. For each of the remaining distributions, the controller may perform similar operations to determine a particular read level of a given odd or even distribution.

Figure 4:
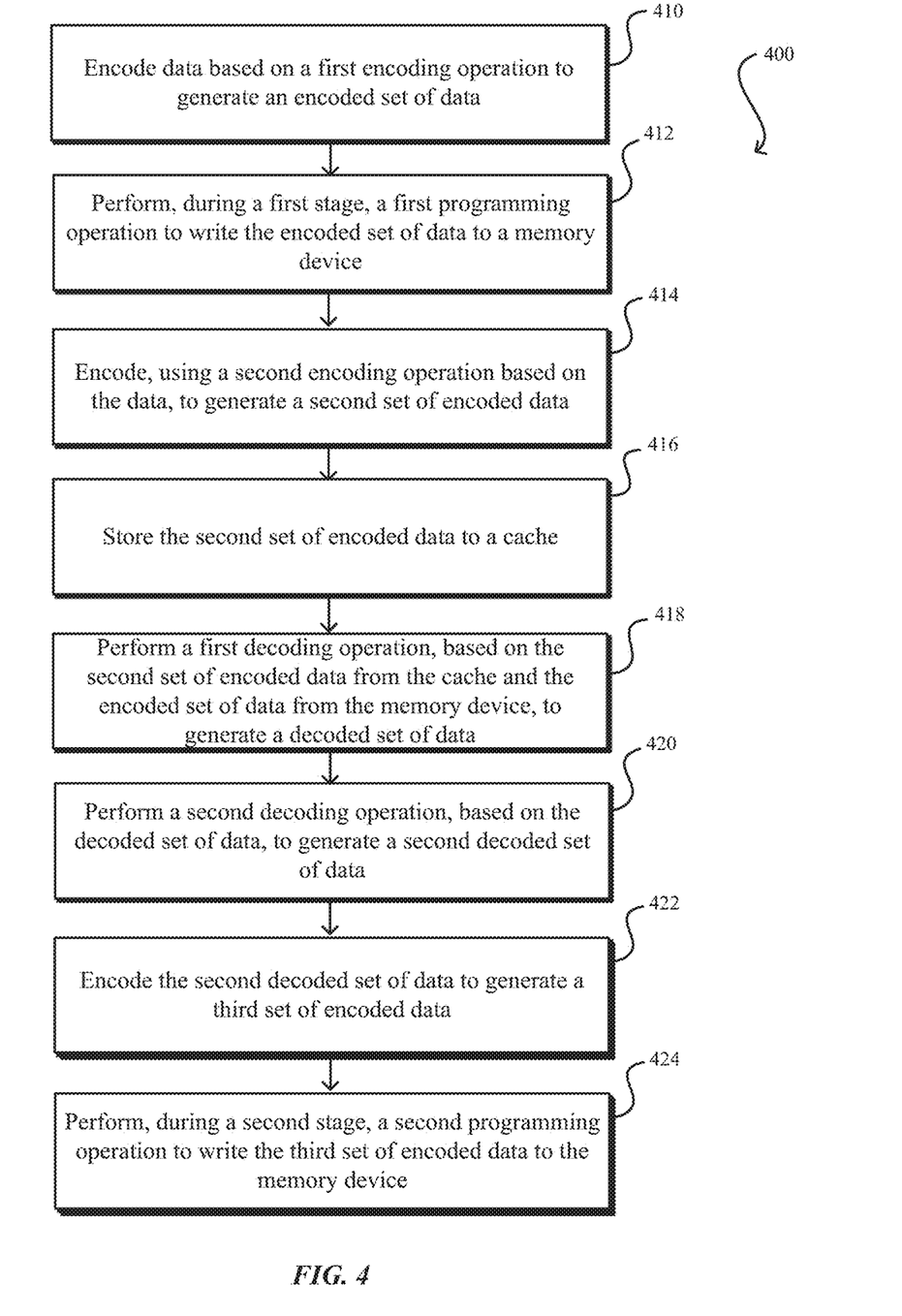
FIG. 4 shows a flowchart of a process for performing foggy/fine programming in accordance with one or more implementations.

FIG. 4 shows a flowchart of a process 400 for performing foggy/fine programming in accordance with one or more implementations. Further for explanatory purposes, the blocks of the process 400 are described herein as occurring in serial, or linearly. However, multiple blocks of the process 400 may occur in parallel. In addition, the blocks of the process 400 need not be performed in the order shown and/or one or more blocks of the process 400 need not be performed and/or can be replaced by other operations. One or more blocks of FIG. 4 may be executed by a flash storage system (including, e.g., a controller of a flash memory device, a data storage controller of a data storage system or a solid state storage device (SSD), a processor, or the like). Examples of a flash storage system or a controller may be the flash storage system 110 and/or the controller 120. Similarly, a non-transitory machine-readable medium may include machine-executable instructions thereon that, when executed by a computer or machine, perform the blocks of FIG. 4. The steps of process 400 may be implemented as hardware/firmware or software. FIG. 4 will be described by reference to components of the flash storage system 110.

The process 400 may initiate when host data (e.g., from host 150) is received by the ECC encoder 162. In an example where a given flash memory device uses QLC memory, four pages of data may be received from the host for programming to the flash memory device. At 410, the ECC encoder 162 encodes data based on a first encoding operation to generate an encoded set of data. The first encoding operation may be based on an ECC encoding scheme.

As described before, foggy/fine programming may be implemented using two different programming stages (e.g., a first stage and a second stage). At 412, the ECC encoder performs, during a first stage, a first programming operation to write the encoded set of data to a flash memory device. The first programming operation in this example is a foggy programming operation. Foggy programming, in an example, writes the encoded set of data (e.g., the four pages of data) into a temporary state (e.g., a foggy state) to at least one flash memory device (e.g., at least one of the flash memory devices 130).

The ECC encoder 162 sends the encoded set of data to the foggy encoder 164. At 414, the foggy encoder 164 encodes the encoded set of data based on a second encoding operation to generate a second set of encoded data. The second encoding operation, as discussed before, is an XOR operation on the encoded set of data, which includes the four pages of data. In an example, the result of the XOR operation is the second set of encoded data that includes a portion of the encoded set of data (e.g., one page of data). At 416, the foggy encoder 164 stores the second set of encoded data to the cache 126.

For reading the four pages of data in the foggy state stored in the flash memory devices 130, as discussed before, the foggy decoder 172 performs a special read command. As mentioned before, this special read command shifts the read thresholds to be in the center of voltage distributions (e.g., not at the intersections of the distributions in a read operation). The foggy decoder can then use the cached page of data in order to decode the four pages of data read from at least one of the flash memory devices 130. In this regard, at 418, the foggy decoder 172 performs a first decoding operation, based on the second set of encoded data from the cache and the encoded set of data from at least one of the flash memory devices 130, to generate a decoded set of data. The first decoding operation includes a foggy decoding operation that was discussed in more detail in FIGS. 3A AND 3B. The foggy decoder 172 then sends the decoded set of data to the ECC decoder 174.

At 420, the ECC decoder 174 performs a second decoding operation, based on the decoded set of data, to generate a second decoded set of data. In an example, the second decoded set of data is re-encoded before being programmed to at least one of the flash memory devices 130. In particular, the data would be decoded (e.g., parity removed) and then re-encoded (e.g., compute parity over again) because the ECC decoder 174 may not pass out the parity after correcting errors and is discarded. Alternatively, in an example, the second decoded data refers to the corrected ECC codewords which include the parity, and re-encoding of the second decoded data may not be performed.

At 422, the ECC decoder (or controller 120) encodes the second decoded set of data to generate a third set of encoded data. It is further understood that this encoding operation re-creates the same data as the encoded set of data that was written to the flash memory devices 130 during the first (e.g., foggy) programming pass, and may include re-computing parity values for the second decoded set of data. At 424, the ECC decoder 174 (or controller 120) performs, during a second stage, a second programming operation to write the third set of encoded data to at least one of the flash memory devices 130.

Various examples of aspects of the disclosure are described below. These are provided as examples, and do not limit the subject technology.

One or more aspects of the subject technology provide methods for providing an improved multi-stage foggy/fine programming with a reduced memory requirement for buffering data. According to some aspects, a method may include encoding data based on a first encoding operation to generate an encoded set of data. The method may also include performing, during a first stage, a first programming operation to write the encoded set of data to a memory device. The method may also include encoding, using a second encoding operation based on the data, to generate a second set of encoded data, wherein an amount of the second set of encoded data is less than an amount of the encoded set of data. The method may also include storing the second set of encoded data to a cache. The method may also include performing a first decoding operation, based on the second set of encoded data from the cache and the encoded set of data from the memory device, to generate a decoded set of data. The method may also include performing a second decoding operation, based on the decoded set of data, to generate a second decoded set of data. The method may include encoding the second decoded set of data to generate a third set of encoded data. The method may also include performing, during a second stage, a second programming operation to write the third set of encoded data to the memory device.

In other aspects, a system may include flash memory devices and a controller. The controller may be configured to encode data based on a first encoding operation to generate an encoded set of data. The controller may also be configured to perform, during a first stage, a first programming operation to write the encoded set of data to at least one of the flash memory devices. The controller may also be configured to encode, using a second encoding operation based on the data, to generate a second set of encoded data, wherein an amount of the second set of encoded data is less than an amount of the encoded set of data. The controller may also be configured to store the second set of encoded data to a cache. The controller may also be configured to perform a first decoding operation, based on the second set of encoded data from the cache and the encoded set of data from the at least one of the flash memory devices, to generate a decoded set of data. The controller may also be configured to perform a second decoding operation, based on the decoded set of data, to generate a second decoded set of data. The controller may be configured to encode the second decoded set of data to generate a third set of encoded data. The controller may also be configured to perform, during a second stage, a second programming operation to write the third set of encoded data to the at least one of the flash memory devices.

In further aspects, a system may include means for encoding data based on a first encoding operation to generate an encoded set of data. The system may further include means for performing, during a first stage, a first programming operation to write the encoded set of data to a memory device. The system may further include means for encoding, using a second encoding operation based on the data, to generate a second set of encoded data, wherein an amount of the second set of encoded data is less than an amount of the encoded set of data. The system may further include means for storing the second set of encoded data to a cache. The system may further include means for performing a first decoding operation, based on the second set of encoded data from the cache and the encoded set of data from the memory device, to generate a decoded set of data. The system may further include means for performing a second decoding operation, based on the decoded set of data, to generate a second decoded set of data. The system may include means for encoding the second decoded set of data to generate a third set of encoded data. The system may further include means for performing, during a second stage, a second programming operation to write the third set of encoded data to the memory device.

In further aspects, a non-transitory machine-readable medium may include machine-executable instructions thereon that, when executed by a processor, perform a method. The method may include encoding data based on a first encoding operation to generate an encoded set of data. The method may also include performing, during a first stage, a first programming operation to write the encoded set of data to a memory device. The method may also include encoding, using a second encoding operation based on the data, to generate a second set of encoded data, wherein an amount of the second set of encoded data is less than an amount of the encoded set of data. The method may also include storing the second set of encoded data to a cache. The method may also include performing a first decoding operation, based on the second set of encoded data from the cache and the encoded set of data from the memory device, to generate a decoded set of data. The method may also include performing a second decoding operation, based on the decoded set of data, to generate a second decoded set of data. The method may include encoding the second decoded set of data to generate a third set of encoded data. The method may also include performing, during a second stage, a second programming operation to write the third set of encoded data to the memory device.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (for example, his) include the feminine and neuter gender (for example, her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A data storage system, comprising:
   memory; and
   one or more controllers configured to cause:
      encoding data to generate a first set of encoded data;
      writing, during a first phase, the first set of encoded data to the memory;
      encoding the first set of encoded data to generate a second set of encoded data;
      receiving the first set of encoded data from the memory and the second set of encoded data;
      performing one or more decoding operations, based on the received first and second sets of encoded data, to generate a set of decoded data;
      encoding the set of decoded data to generate a third set of encoded data; and
      writing, during a second phase, the third set of encoded data to the same memory.

2. The data storage system of claim 1, wherein:
   encoding the data comprises encoding the data using a first encoding operation; and encoding the first set of encoded data comprises encoding the first set of encoded data using a second encoding operation that is different from the first encoding operation.

3. The data storage system of claim 1, wherein an amount of the second set of encoded data is less than an amount of the first set of encoded data.

4. The data storage system of claim 1, wherein performing the one or more decoding operations comprises:
performing a first decoding operation, based on the first set of encoded data from the memory and the second set of encoded data, to produce a first set of decoded data; and
performing a second decoding operation, based on the first set of decoded data, to generate the set of decoded data.

5. The data storage system of claim 1, wherein:
writing during the first phase comprises a foggy programming operation; and
writing during the second phase comprises a fine programming operation.

6. The data storage system of claim 1, wherein the one or more decoding operations comprise a foggy decoding operation and an error-correcting code decoding operation.

7. The data storage system of claim 1, wherein:
the one or more controllers are configured to receive host data from a host device;
the data comprises the host data;
encoding the data comprises generating, using an error-correcting code encoding scheme, a set of encoded pages based on the host data, wherein the first set of encoded data comprises the set of encoded pages; and
encoding the first set of encoded data comprises performing a foggy encoding operation on the set of encoded pages.

8. The data storage system of claim 1, wherein the one or more controllers are configured to cause: generating an additional page of data based on an XOR operation of a number of bits of data in each cell of the memory.

9. The data storage system of claim 1, wherein the first set of encoded data comprises four pages of data, and the second set of encoded data comprises one page of data, and the set of decoded data comprises four pages of data.

10. The data storage system of claim 1, wherein the one or more controllers are configured to cause: prior to performing the one or more decoding operations, storing the second set of encoded data to a second memory that is different from the memory.

11. The data storage system of claim 10, wherein:
the second set of encoded data stored in the second memory comprises additional parity bits for an error-correcting code; and
the third set of encoded data comprises the same data as the first set of encoded data.

12. A method for a data storage system, the method comprising:
encoding data to generate a first set of encoded data;
writing, during a first phase, the first set of encoded data to memory;
encoding the first set of encoded data to generate a second set of encoded data;
receiving the first set of encoded data from the memory and the second set of encoded data;
performing one or more decoding operations, based on the received first and second sets of encoded data, to generate a set of decoded data;
encoding the set of decoded data to generate a third set of encoded data; and
writing, during a second phase, the third set of encoded data to the same memory.

13. The method of claim 12, wherein:
encoding the data comprises encoding the data using a first encoding operation; and
encoding the first set of encoded data comprises encoding the first set of encoded data using a second encoding operation that is different from the first encoding operation.

14. The method of claim 12, wherein an amount of the second set of encoded data is less than an amount of the first set of encoded data.

15. The method of claim 12, wherein performing the one or more decoding operations comprises:
performing a first decoding operation, based on the first set of encoded data from the memory and the second set of encoded data, to produce a first set of decoded data; and
performing a second decoding operation, based on the first set of decoded data, to generate the set of decoded data.

16. The method of claim 12, wherein:
writing during the first phase comprises a foggy programming operation; and
writing during the second phase comprises a fine programming operation.

17. The method of claim 12, comprising: prior to performing the one or more decoding operations, storing the second set of encoded data to a second memory that is different from the memory.

18. The method of claim 17, wherein:
the second set of encoded data stored in the second memory comprises additional parity bits for an error-correcting code; and
the third set of encoded data comprises the same data as the first set of encoded data.

19. An apparatus, comprising:
means for encoding data to generate a first set of encoded data;
means for writing, during a first phase, the first set of encoded data to memory;
means for encoding the first set of encoded data to generate a second set of encoded data;
means for performing one or more decoding operations, based on the first set of encoded data from the memory and the second set of encoded data, to generate a set of decoded data;
means for encoding the set of decoded data to generate a third set of encoded data; and
writing, during a second phase, the third set of encoded data to the same memory.

20. The apparatus of claim 19, wherein:
the means for encoding data comprises means for encoding the data using a first encoding operation; and
the means for encoding the first set of encoded data comprises means for encoding the first set of encoded data using a second encoding operation that is different from the first encoding operation.

* * * * *